United States Patent [19]

Mashiko et al.

[11] Patent Number: 4,990,489
[45] Date of Patent: Feb. 5, 1991

[54] READ ONLY MEMORY DEVICE INCLUDING A SUPERCONDUCTIVE ELECTRODE

[75] Inventors: Yoji Mashiko; Tadashi Nishioka, both of Hyogo, Japan

[73] Assignee: Mitsubishi Denki Kabushiki Kaisha, Tokyo, Japan

[21] Appl. No.: 215,802

[22] Filed: Jul. 6, 1988

[30] Foreign Application Priority Data

Jul. 6, 1987 [JP] Japan .................. 62-167049

[51] Int. Cl.$^5$ .............................................. G11C 11/44
[52] U.S. Cl. ............................ 505/1; 365/160; 365/94; 365/104; 505/700; 505/706; 505/831; 505/841
[58] Field of Search .......................... 505/1, 830–832, 505/838, 841; 365/94, 96, 104, 160, 161–163

[56] References Cited

U.S. PATENT DOCUMENTS

| | | | |
|---|---|---|---|
| 3,500,344 | 3/1970 | LaCroix | 365/160 |
| 3,629,863 | 12/1971 | Neale | 365/163 |
| 3,641,517 | 2/1972 | Brilman et al. | 365/160 |
| 3,691,539 | 9/1972 | Erber et al. | 365/160 |
| 4,238,839 | 12/1980 | Redfern et al. | 365/104 |
| 4,336,523 | 1/1982 | Jaggi . | |
| 4,360,898 | 11/1982 | Faris | 365/162 |
| 4,384,345 | 5/1983 | Mikome | 365/94 |
| 4,633,439 | 12/1986 | Harada | 365/104 |

FOREIGN PATENT DOCUMENTS

| | | | |
|---|---|---|---|
| 1564679 | 2/1970 | Fed. Rep. of Germany . | |
| 58-158099 | 9/1983 | Japan | 365/94 |
| 60-211698 | 10/1985 | Japan | 365/94 |

OTHER PUBLICATIONS

IBM Tech. Discl. Bull., vol. 21, No. 1, Jun. 78, pp. 406–407, "Flux Programmable Memories" by Faris.
IEEE Transaction on Magnetics, vol. MaG-15, No. 1, Jan. 79, pp. 486–487, "*** Josephson Logic & Memory Applications", by Jillie.
J P Journal of Applied Physics, vol. 26, No. 5, May 87, pp. L699-L700, "Metallurgical Analysis of Mix-Phase V-Ba-Cu Oxides" by Takagi.
ISSCC 77, Feb. 16, 77, PROM, A 1024 Bit, Fused-Link, pp. 190–191, CMOS PROM, IEEE (Solid State Circuit Conference) by Schroeder.
Nature, vol. 327, May 28, 1987, Superconductive Ceramics by Welch et al., pp. 278–279.
Microwave & RF, Jul. 87, Superconductivity, pp. 35–43, by Brus.
Advanced Ceramics, vol. 2, No. 3B, Jul. 87, pp. 421–429 by Cuomo et al.
IEEE Electron Device Letters, vol. EDL-8, No. 12, Dec. 87, pp. 582–585, Superconductors, by Kwon et al.

(List continued on next page.)

*Primary Examiner*—Stuart N. Hecker
*Assistant Examiner*—Alfonso Garcia
*Attorney, Agent, or Firm*—Lowe, Price, Leblanc, Becker & Shur

[57] ABSTRACT

A read only memory device includes a first electrode and a second electrode arranged in an overlapping relation with the first electrode so as to be geometrically in connection at an intersection therewith corresponding to a storage location for one type of data. At least one of the first and second electrodes is formed of a ceramics system high temperature superconductor. A prescribed one of the two electrodes which is formed of the high temperature superconductor has a high resistance region for insulating the first and second electrodes from each other at an intersection corresponding to a storage location for another type of stored data. The high resistance region is formed by irradiating an intersection with a focused ion beam.

13 Claims, 6 Drawing Sheets

OTHER PUBLICATIONS

IEEEE Int'l Sol. St. Circuits Conf.: "MAS-ROM—Electrically—Reprogramma ROM with Decoder" by K. Onoda et al., Session V: Memory 11, 2/16/72, pp. 54–55.

Jap. J. of Appl. Phys.: "Superconductivity at 95 K in New Yb-Ba-Cu Oxide System", by K. Kitazawa et al., vol. 26, No. 4, 4/87, pp. L339-L341.

Jap. J. of Appl. Phys.: "High Resolution Transmission Electron Microscopy of Defects in High Te Superconductor BaYCuO", by Y. Matsui et al., vol. 26, #5, 5/87, pp. L777-L779.

Jap. J. of Appl. Phys.: "High Te Y-Ba-Cu-O Thin Films Prepared by Dual Magmetron Sputtering", by H. Asano et al, vol. 26, #7, 7/87, pp. L1221-L1222.

J. Vac. Sci. Technol.: "Integrated Circuit Repair Using Focused Ion Beam Milling", by L. R. Harriott et al, B4 (1) Jan./Feb. 1986, pp. 181–184.

J. Appl. Phys.: "Characteristics of Rapid Thermal Annealing in Ion-Implanted Silicon", by O. W. Holland et al, 59 (3), Feb. 1, 1986, pp. 905–909.

READ ONLY MEMORY DEVICE INCLUDING A SUPERCONDUCTIVE ELECTRODE

BACKGROUND OF THE INVENTION

1. Field of the Invention

The present invention relates to a read only memory (hereinafter referred to as ROM) device and the method for making the same in which the presence/absence of the electrical contact between two electrodes arranged overlapping with each other constitutes the stored data. More specifically, it relates to a ROM device and the method for making the same in which the writing of the stored data is simple and the reading of the stored data can be carried out at high speed.

2. Description of the Prior Art

An example of a conventional typical ROM device is disclosed in, for example, *Digest of Technical Papers of IEEE International Solid State Circuits Conference* (1972, pp. 54-55 and pp. 152-153).

Figure 1:
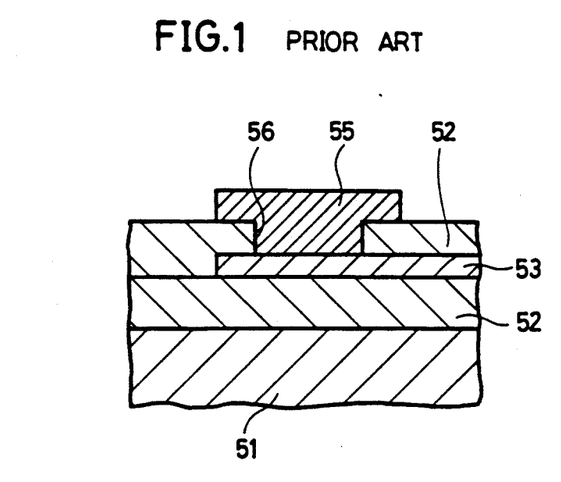
FIG. 1 is a vertical sectional view of a connected intersecting portion between a gate electrode and a electrode wiring in a conventional ROM device.
Figure 2:
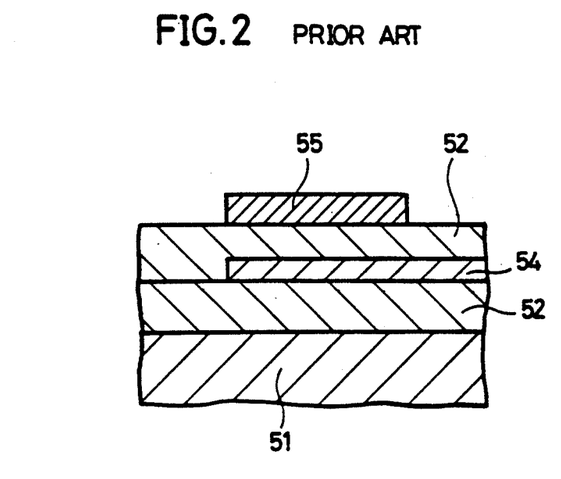
FIG. 2 is a vertical sectional view of a non-connected intersecting portion of a gate electrode and a electrode wiring in a conventional ROM device.

In such a conventional ROM device, the data is stored dependent on the presence/absence of the connection at the intersection between a gate electrode of a MOS transistor and the electrode wiring. FIGS. 1 and 2 are vertical sectional views of the intersecting portion. FIG. 1 shows a connected intersection and FIG. 2 shows a non-connected intersection. A reference numeral 51 denotes a silicon substrate. 52 denotes silicon dioxide layers (insulating layers) interposed between the silicon substrate 51 and each of the electrode wiring 53 and 54 and between each of the electrode wirings 53 and 54 and a signal line 55. 56 denotes a hole selectively formed on the insulating layer 52 for conducting the intersection.

In this conventional ROM device, the presence/absence of the connection between the gate electrode of the MOS transistor and the electrode wiring, that is, the presence/absence of the hole 56 is read as a stored data. Therefore, in order to store the data, a hole 56 should be selectively formed beforehand. Therefore, prior to the step of arranging electrodes of each signal line 55, the insulating layer is processed to form the hole 56 employing a number of masks corresponding to the data pattern.

As described above, since the conventional ROM device stores data by the presence/absence of a hole 56 in the insulating layer 52, it took long time for processing the insulating layer 52, causing higher cost. In addition, the conductivity of the electrode constituting signal line 55 is not sufficient for required high speed reading.

SUMMARY OF THE INVENTION

A primary object of the present invention is to provide a ROM device in which the stored data can be easily formed.

Another object of the present invention is to provide a ROM device in which the conductivity of the signal line is enhanced to enable high speed reading.

A further object of the present invention is to provide a method for manufacturing the ROM device in a short time and in a simple manner.

A ROM device in accordance with the present invention comprises: an active element having an input/output portion; a first electrode connected to the input/output portion; and a second electrode arranged overlapping with the first electrode so as to be geometrically connected thereto at the intersection; wherein at least one of the first and the second electrodes is formed of a ceramic system high temperature superconductor. A prescribed electrode out of the electrodes formed of the ceramics system high temperature superconductor has a high resistance region for insulating said first and second electrodes at the intersection corresponding to a prescribed stored data.

The high resistance region is formed of, for example, a material having high resistance and no superconductivity, which is formed by the destruction of the crystal structure of a high temperature superconductor. The high temperature superconductor comprises, for example, a derivative crystal structure of perovskite structure of Y-Ba-Cu-O system.

A method for manufacturing the ROM device in accordance with the present invention comprises the steps of: preparing a semiconductor substrate; forming an active element on the semiconductor substrate; forming a first electrode having its one end connected to an input/output portion of the active element and a second electrode arranged overlapping with the first electrode so as to be geometrically in connection with the same at the intersection on the semiconductor substrate; wherein at least one of the first and second electrodes is formed of a ceramics system high temperature superconductor; and forming a high resistance region by a forcussed ion beam irradiating an intersection out of the intersections which is in correspondence with a prescribed data to be stored.

The high resistance region is formed of a material having high resistance and no superconductivity, which is formed by the destruction of the crystal structure of a high temperature superconductor. The high temperature superconductor is formed by, for example, sputter deposition method.

In the ROM device in accordance with the present invention, a geometrically connected intersection can be easily rendered electrically non-conductive by means of a high resistance region, and the stored data can be read from the intersection at high speed through a ceramics system high temperature superconductor having low resistance.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 8A to 8F are partial vertical sectional views showing in a stepwise manner a method for manufacturing an ROM device in accordance with the present invention;

DESCRIPTION OF THE PREFERRED EMBODIMENTS

Figure 3:
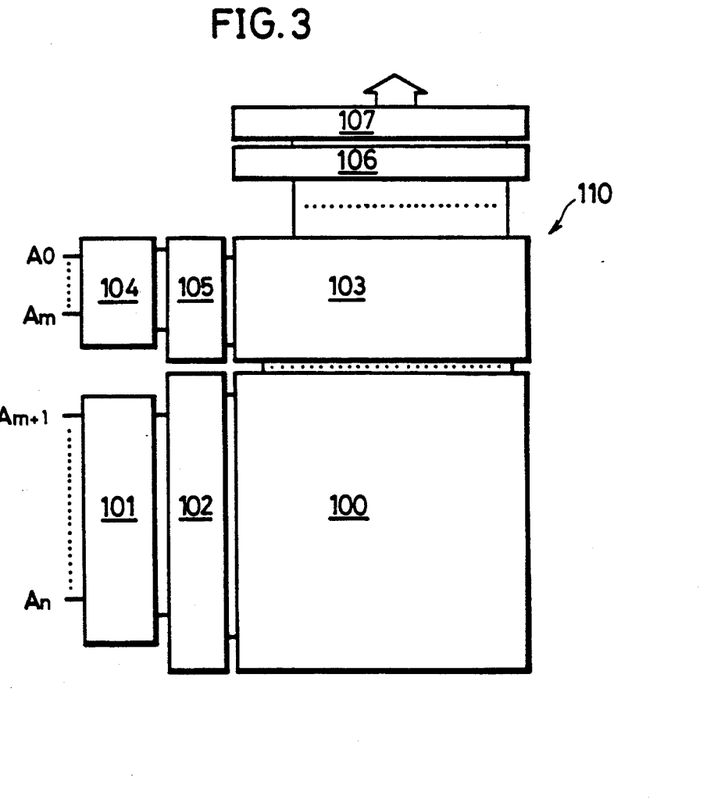
FIG. 3 is a schematic diagram showing the whole structure of one embodiment of a ROM device in accordance with the present invention.

Referring to FIG. 3 showing the whole structure of one embodiment of the ROM device in accordance with the present invention, an address driver 101 for selecting rows and a decoder 102 are connected to a memory cell array 100. A multiplexer 103 is connected to the memory cell array 100 and an address driver 104 to which signals for selecting columns are inputted and a decoder 105 are connected to the multiplexer 103. A sense circuit 106 at the output side and an output driver 107 are connected to the multiplexer 103.

Figure 4:
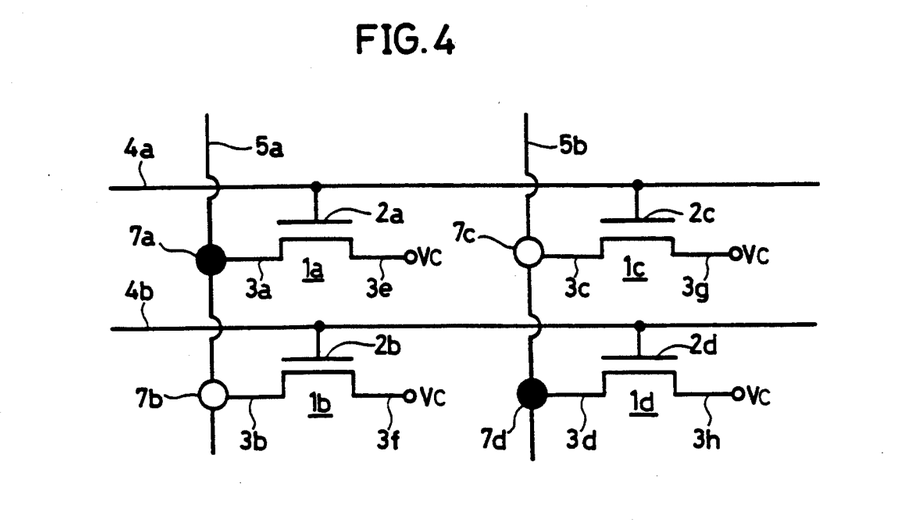
FIG. 4 is a schematic diagram of one portion of a memory cell array shown in FIG. 3.

FIG. 4 is a schematic diagram showing one portion of the memory cell array 100 of FIG. 3. Referring to FIG. 4, MOS transistors 1a to 1d constituting each memory cell are parts of a number of MOS transistors arranged in a matrix. The transistors 1a to 1d respectively comprise gate electrodes 2a to 2d, source electrodes 3a to 3d, and drain electrodes 3e to 3h to which a constant voltage $V_c$ is applied. A word line 4a is connected to the gate electrodes 2a and 2c. A word line 4b is connected to the gate electrodes 2b and 2d. A signal line 5a is selectively connected to the source electrodes 3a and 3b. A signal line 5b is selectively connected to the source electrodes 3c and 3d. As for the intersections 7a to 7d between the source electrodes 3a to 3d and the signal lines 5a to 5b, the intersections 7a and 7d marked black are connected and intersections 7b and 7c marked white are not connected. Although only four memory cells are shown in FIG. 4, a number of memory cells are arranged actually and the required number of word lines and signal lines are provided.

Figure 5:
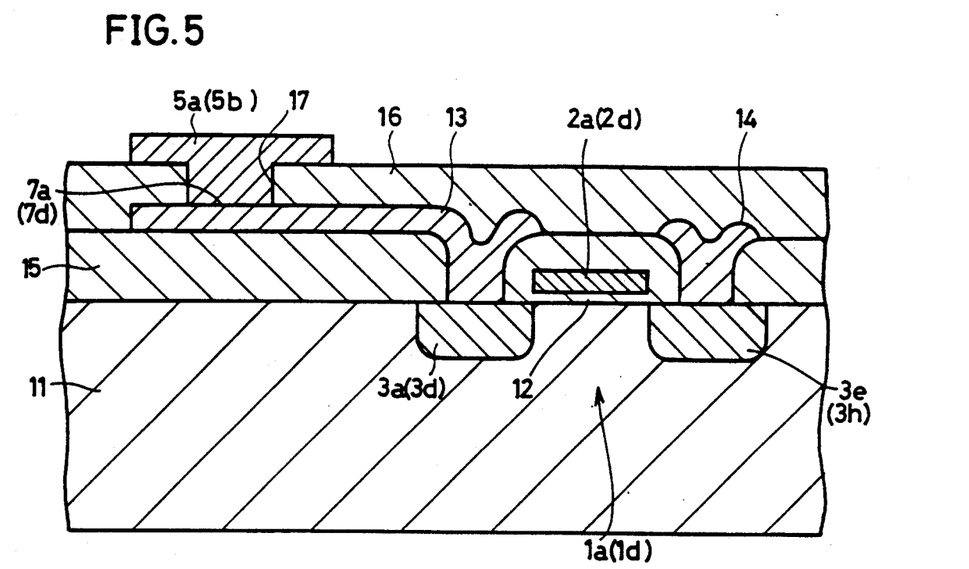
FIG. 5 is a vertical sectional view of one memory cell portion of the embodiment of FIG. 3, with the intersection being connected.

The portion of the connected intersection 7a (7d) is structured as shown more definitely in FIG. 5. Referring to FIG. 5, a gate electrode 2a (2d) is placed on a surface region of a silicon substrate 11 with a dielectric film 12 interposed therebetween. A source electrode 3a (3d) and a drain electrode 3e (3h) formed of impurity diffusion layers are formed on the surface region 12 of the silicon substrate 11 adjacent to the gate electrode 2a (2d). A lower end of a metal wiring 13 arranged over the silicon substrate 11 is connected to the source electrode 3a (3d). A metal wiring 14 is connected to the drain electrode 3e (3h), and a constant voltage $V_c$ is applied to the metal wiring. Interlayer insulating films 15 are formed on the surface region of the silicon substrate 11 where the source electrode 3a (3d) and the drain electrodes 3e (3h) are not formed. The chip end portion of the metal wiring 13 extends along the upper surface of the interlayer insulating film 15 to the intersection 7a (7d) almost in parallel to the upper surface of the silicon substrate 11. A surface protecting film 16 is further provided on the metal wirings 13 and 14. A hole 17 is provided at the position corresponding to the intersection 7a (7d) on the surface protection film 16. The signal line 5a (5b) formed on the surface protecting film 16 is connected to the metal wiring 13 through the hole 17. The metal wiring 13 constitute a first electrode of the lower layer of the stacked electrodes. The signal line 5a (5b) constitutes a second electrode of the upper layer.

The signal line 5a (5b) is formed of a ceramics system high temperature superconductor. The ceramics system high temperature superconductor comprises a prescribed crystal structure, as shown in the derivative structure of, for example Y-Ba-Cu-O system perovskite structure. The superconductor employed herein is not limited to the above and various superconductors having such crystal structure as shown in Matsui et al. "High resolution Transmission Electron Microscopy of Defects in High Ic Superconductor, Ba$_2$YCu$_3$Oy" (JAPANESE JOURNAL OF APPLIED PHYSICS Vol. 26, No. 5, MAY, 1987, pp. L777-L779) and Kitazawa et al. "Superconductivity at 95K in the New Yb-Ba-Cu Oxide System" (JAPANESE JOURNAL OF APPLIED PHYSICS VOL. 26, No. 4, APRIL, 1987, pp. L339-L341) may be employed. In consideration of the necessity of cooling, those materials which become superconductive at higher temperature are preferred.

Figure 6:
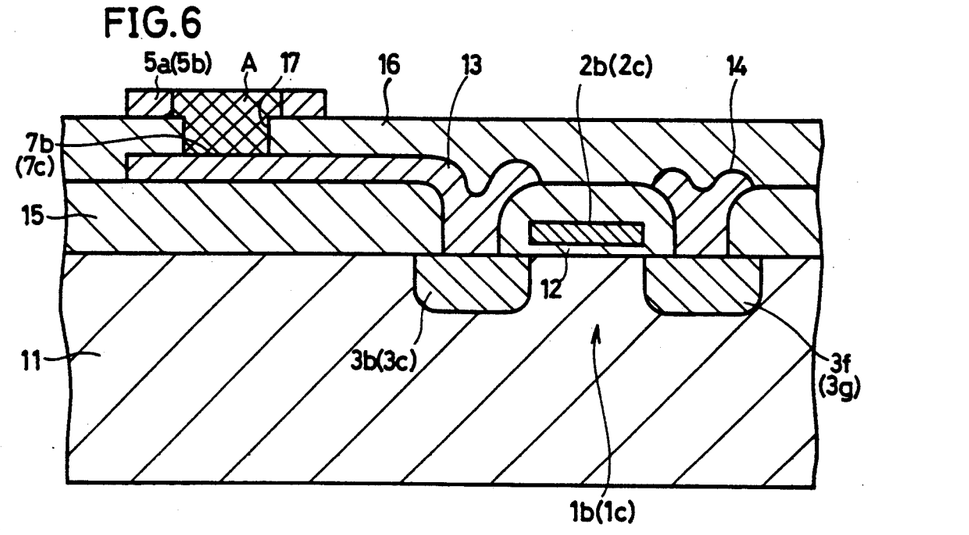
FIG. 6 is a vertical sectional view of another one memory cell portion of the embodiment of FIG. 3, with the intersection not being connected.

The portion of the intersection 7b (7c) which is not connected has the structure shown in FIG. 6. The structure of the portion shown in FIG. 6 is almost the same as the structure of the portion shown in FIG. 5, and the corresponding portions are denoted by the same reference characters. In the structure shown in FIG. 6, the crystal structure is destroyed and is converted into a material having high resistance and no superconductivity to form a high resistance region A at the portion of the signal line 5a (5b) corresponding to the hole 17 of the protecting film 16. By means of the existence of the high resistance region A, the signal line 5a (5b) and the metal wiring 13 are not electrically connected.

Figure 7:
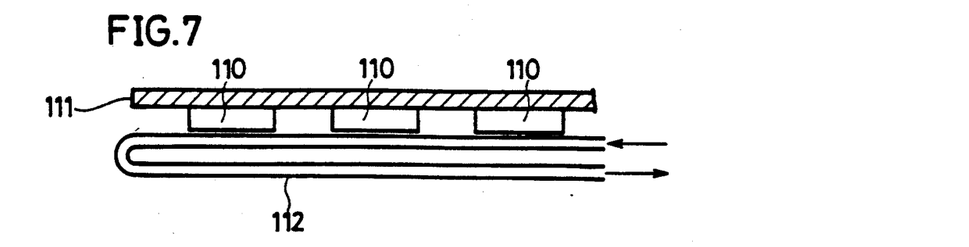
FIG. 7 is a partial vertical sectional view showing the ROM device of FIG. 3 in operation.

The above described ROM device 110 is employed in the structure such as shown in FIG. 7. Referring to FIG. 7, the ROM device 110 is fixed at the lower surface of the substrate 111. A cooling apparatus 112 is placed below the ROM device 110. The cooling apparatus 112 is structured such that a liquid nitrogen, for example, flows through a pipe, whereby the ROM device 110 is cooled. If the superconductor employed for the signal lines 5a and 5b becomes superconductive at high temperature, then a special cooling apparatus such as the cooling apparatus 112 becomes unnecessary. If a superconductor which is superconductive at the ordinary room temperature is employed for the signal lines 5a and 5b, then the cooling apparatus is not necessary. Assuming that the word line 4a and the signal line 5a of FIG. 4 are selected by the signals from the address drivers 101 and 104, the voltage at the gate electrode 2a is increased so that the gate of the MOS transistor 1a opens. Consequently, the voltage $V_c$ is read from the signal line 5a through the electrode wiring 3a and the intersection 7a. Meanwhile, assuming that the word line 4b and the signal line 5a are selected, the voltage at the gate electrode 2b is increased so that the gate of the MOS transistor 1b opens. In this case, however, the voltage $V_c$ is not read from the signal line 5a, since the intersection 7b is not electrically connected. In this manner, whether each of the intersections 7a to 7d is connected or not, that is, whether a high resistance region A exists at each of the intersections 7a to 7d constitutes the stored data.

One embodiment of a method for manufacturing the ROM device in accordance with the present invention will be described in the following.

Figure 8A:
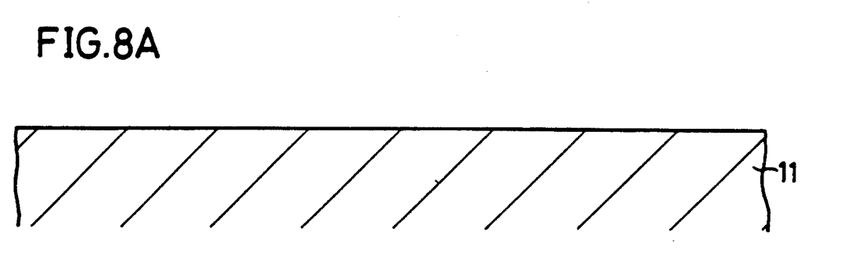
Figure 8B:
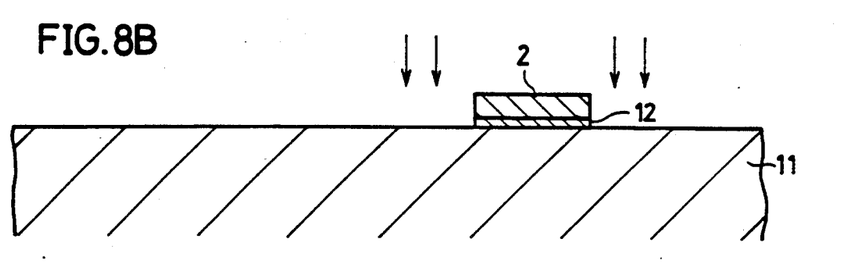
Figure 8C:
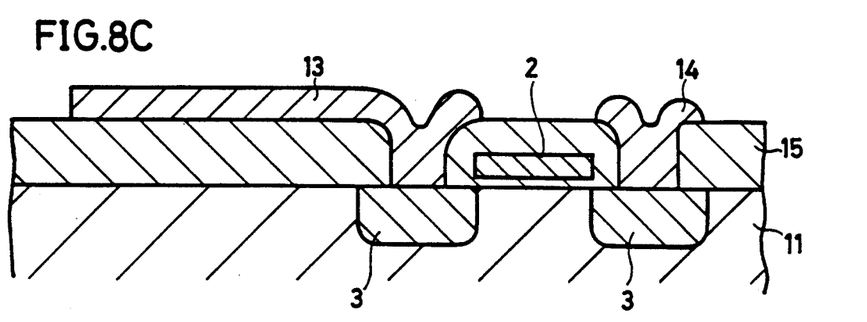
Figure 8D:
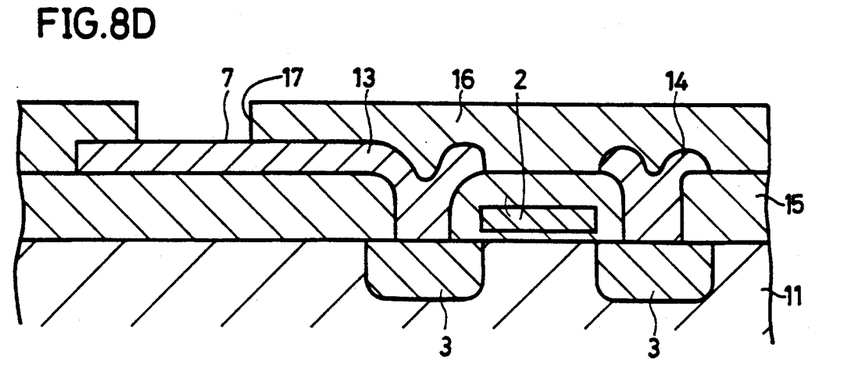

First, a dielectric film 12 is formed on a main surface of a silicon substrate 11 such as shown in FIG. 8A, and a gate electrode 2 is formed thereon (FIG. 8B). Thereafter, arsenic ion implantation is carried out on the main surface of the silicon substrate 11, employing the gate electrode 2 as a mask. As shown in FIG. 8C, the source/drain electrode 3 is formed on a prescribed region of the silicon substrate 11 by the arsenic ion implantation. The main surface of the silicon substrate 11 is covered with an interlayer insulating film 15 and a contact hole is formed at a position at the interlayer insulating film 15 which position is in correspondence with the electrode 3. Thereafter, metal wirings 13 and 14 are formed on the interlayer insulating film 15 and each of the metal wirings 13 and 14 is connected to the source/drain electrode 3 through the contact hole. A source protecting film 16 is formed further thereon, and a contact hole 17 is formed at a prescribed position of the surface protecting film 16 (FIG. 8D).

Thereafter, at the position corresponding to the contact hole 17, a signal line 5 formed of a ceramics system high temperature superconductor is formed on the surface protecting film 16 as shown in FIG. 9E. The signal line 5 is connected to the metal wiring 13 through the contact hole 17. By doing so, the structure of the portion of the intersection 7a (7d) such as shown in FIG. 5 is obtained. At the intersections, the electrically connected intersections 7a and 7d can be easily formed, since the conductivity of the signal lines 5a and 5b is high at the superconductive temperature range. The signal lines 5a and 5b of the ceramics system high temperature superconductor are formed using a general manufacturing method such as sputter deposition method. The manufacturing method is disclosed in, for example, "High-Tc Y-Ba-Cu-O Thin Films Prepared by Dual Magnetron Sputtering" (JAPANESE JOURNAL OF APPLIED PHYSICS Vol. 26, No. 7, JULY, 1987, pp. L1221-L1222).

Thereafter, in order to provide electrically non-connected intersections 7b and 7c, the portions of the signal line 5 which correspond to the contact holes 17 are irradiated by an accelerated focused ion beam. Consequently, the crystal structure at the portions corresponding to the contact holes 17 of the intersections 7b and 7c are destroyed by the shock of the focused ion beam, whereby it is converted into a material having high resistance but no superconductivity. In this manner, the high resistance region A such as shown in FIG. 6 is formed. The technique of focused ion beam irradiation such as shown in, for example, L.R. Harriott et al. "Integrated circuit repair using focused ion beam milling" (J. Vac. Sci. Technol., B4(1), Jan/Feb, 1986) and O.W. Holland et al. "Characteristics of rapid thermal annealing in ion implanted silicon" (J. Appl. Phys., 59(3), 1 February, 1986) are used.

As described above, by selectively irradiating the focused ion beam, the high resistance regions A can be formed at arbitrary intersections 7b and 7c, whereby the data to be stored can be easily written after the step of arranging electrodes of the signal lines 5a and 5b. In addition, since a superconductor is used for the signal lines 5a and 5b, the reading of the stored data can be carried out at high speed.

Figure 9:
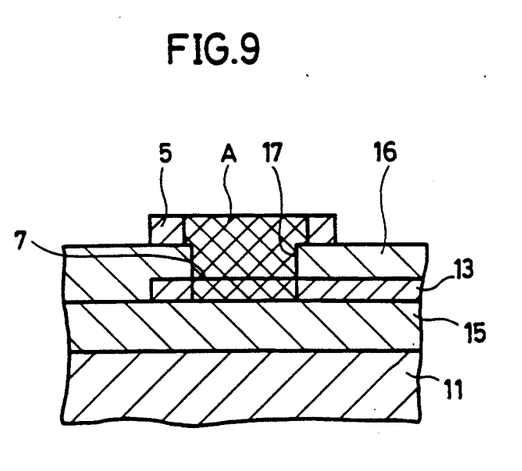
FIG. 9 is a partial vertical sectional view of another embodiment of the present invention.
Figure 10:
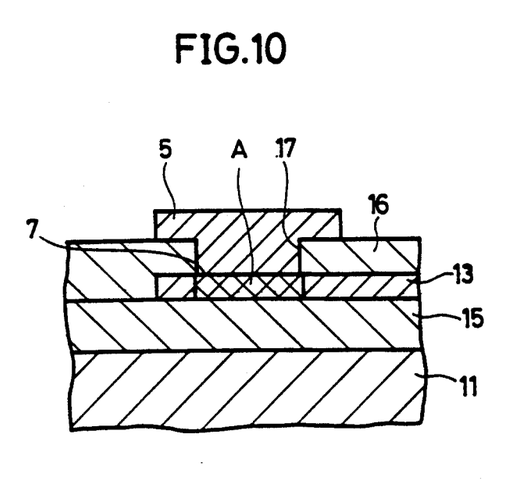
FIG. 10 is a partial vertical sectional view of a further embodiment of the present invention.

Although the signal lines 5a and 5b are formed of the ceramics system high temperature superconductor and the metal wiring 13 of the. MOS transistors 1a to 1d are formed of ordinary metals in the above described embodiment, it goes without saying that the same effect can be obtained only by forming at least one of the overlapping first and second electrodes with the ceramics system high temperature superconductor. Therefore, if the signal line 5 and the metal wiring 13 are both formed of ceramics system high temperature superconductor as shown in FIG. 9, the high resistance region A may be also formed on the metal wiring 13. If the metal wiring 13 is formed of the ceramics system high temperature superconductor as shown in FIG. 5, the high resistance region A should be formed on the metal wiring 13.

As described above, according to the present invention, at least one of the overlapping first and second electrodes is formed of a ceramics type high temperature superconductor, each of the electrodes is geometrically connected at the intersection, and a high resistance region is selectively provided at the ceramics system high temperature superconductor at the intersection, whereby the writing of the data to be stored can be easily carried out by means of the high resistance region, and, in addition, the stored data can be read at high speed from the intersection through the ceramics system high temperature superconductor. According to the manufacturing method of the present invention, at least one of the overlapping first and second electrodes is formed of the ceramics system high temperature of the superconductor, each electrode is geometrically connected at the intersection in advance, and thereafter the intersection is selectively irradiated by the focused ion beam, whereby a method for manufacturing a ROM device is provided in which a high resistance region can be easily provided at the ceramics system high temperature superconductor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A read only memory device, comprising:
an array of memory cells, each cell including:
an active element having an input/output portion;
a first electrode electrically connected to said input/output portion, said first electrode arranged in an insulating film; and
a second electrode arranged overlapping with said first electrode so as to be geometrically connected to the same at an intersection;
said insulating film having a hole at a position corresponding to said intersection, said second electrode connected to said first electrode through said hole;
at least one of said first and second electrodes being formed of a ceramics system high temperature superconductor selectively operating at a superconducting state; and
said at least one of said first and second electrodes formed of the ceramics system high temperature superconductor operating at a non-superconducting state for at least one of said memory cells and having a high resistance region for insulating said first and second electrodes from each other at said intersection corresponding to a prescribed stored data, wherein data output from an addressed memory cells is determined by the superconducting or non-superconducting state of the ceramics system superconductor electrode.

2. A read only memory device, comprising:

an active element having an input/output portion;

a first electrode electrically connected to said input/output portion; and a second electrode arranged overlapping with said first electrode so as to be geometrically connected to the same at an intersection;

at least one of said first and second electrodes being formed of a ceramics system high temperature superconductor operating at a superconducting state; and said at least one of said first and second electrodes formed of the ceramics system high temperature superconductor having a high resistance region for insulating said first and second electrodes from each other at said intersection corresponding to a prescribed stored data, wherein said high resistance region is formed of a non-superconductive material made by destroying crystal structure of a high temperature superconductor.

3. A read only memory device according to claim 2, wherein said high temperature superconductor is a ceramics.

4. A read only memory device according to claim 3, wherein said high temperature superconductor comprises a derivative crystal structure of Y-Ba-Cu-O system perovskite structure.

5. A read only memory device according to claim 1, wherein said second electrode is a signal line and said signal line is formed of the high temperature superconductor.

6. A read only memory device according to claim 1, wherein said high resistance region is arranged in said hole.

7. A read only memory device according to claim 6, further comprising a word line; wherein said active element is a field effect transistor having a source electrode connected to said first electrode, a drain electrode to which a constant voltage is applied, and a gate electrode connected to said word line.

8. A read only memory device according to claim 7, wherein said active element and said intersection are included in said memory cell.

9. A read only memory device according to claim 8, which further comprises:

a first input circuit connected to said memory cell array;

a multiplexer connected to said memory cell array;

a second input circuit connected to said multiplexer; and an output circuit connected to said multiplexer.

10. A read only memory device according to claim 9, which further comprises a cooling apparatus arranged for cooling said memory cell array.

11. A read only memory device according to claim 10, wherein said cooling apparatus is an apparatus employing liquid nitrogen.

12. A read only memory device comprising:

a plurality of memory cells, each memory cell including a transistor, each transistor having an electrode, each memory cell associated with a signal line, each memory cell further having an intersecting contact between a signal line associated therewith and the electrode of the transistor therein, at least one of the intersecting signal line and electrode being formed of a superconductive material at each intersection, the superconductive material of at least one intersection operating in a superconductive state, the crystal structure of the superconductive material of at least another of the intersections is destroyed, thereby providing a high resistance, non-superconducting, contact at said at least another intersection.

13. A read only memory device as recited in claim 12, wherein each said memory cell includes a surface protecting film between a respective signal line and an electrode thereof, and wherein a hole is provided in said surface protecting film at each intersection between a signal line and an electrode, whereby physical contact is provided between each electrode of a memory cell transistor and a corresponding signal line while electrical contact between a memory cell electrode and a corresponding signal line is disrupted at said at least another intersection.

* * * * *